(12) United States Patent
Ocegueda Gallaga et al.

(10) Patent No.: US 10,622,328 B2
(45) Date of Patent: Apr. 14, 2020

(54) CONTROL WIRE CLAMP AND LOOP SYSTEMS AND METHODS

(71) Applicant: POLYGROUP MACAU LIMITED (BVI), Road Town, Tortola (VG)

(72) Inventors: Victor Hugo Ocegueda Gallaga, Baja California (MX); Shuangyi Lyu, Shenzhen (CN)

(73) Assignee: POLYGROUP MACAU LIMITED (BVI), Road Town (VG)

( * ) Notice: Subject to any disclaimer, the term of this patent is extended or adjusted under 35 U.S.C. 154(b) by 181 days.

(21) Appl. No.: 15/621,396

(22) Filed: Jun. 13, 2017

(65) Prior Publication Data
US 2017/0358550 A1 Dec. 14, 2017

Related U.S. Application Data

(60) Provisional application No. 62/349,853, filed on Jun. 14, 2016.

(51) Int. Cl.
*F16B 2/00* (2006.01)
*H01L 23/00* (2006.01)
*A47G 33/06* (2006.01)
*F16B 2/10* (2006.01)
(Continued)

(52) U.S. Cl.
CPC .............. *H01L 24/45* (2013.01); *A47G 33/06* (2013.01); *A47G 33/10* (2013.01); *F16B 2/10* (2013.01); *F16B 2/18* (2013.01); *H01L 24/78* (2013.01); *H01L 24/85* (2013.01); *H01L 2224/7855* (2013.01); *H01L 2224/78621* (2013.01); *Y10T 403/60* (2015.01)

(58) Field of Classification Search
CPC ...... F16B 2/10; F16B 2/18; H01L 2224/7855; H01L 2224/78621; H01L 24/45; H01L 24/78; H01L 24/85; A47G 33/06; A47G 33/10; Y10T 24/394; Y10T 24/3944; Y10T 24/3947; Y10T 24/3949; Y10T 403/60; Y10T 403/602; Y10T 403/608
See application file for complete search history.

(56) References Cited

U.S. PATENT DOCUMENTS 297,303 A * 4/1884 Sjoberg .................. F16G 11/10
24/134 R
913,469 A * 2/1909 Cleaveland ............. E06B 9/324
24/134 KB
(Continued)

FOREIGN PATENT DOCUMENTS

DE 1 961 243 A1 7/1970
FR 2 542 172 A1 9/1984
(Continued)

OTHER PUBLICATIONS

Extended European Search Report dated Nov. 27, 2017 in corresponding EP Application No. 17175664.6.

*Primary Examiner* — Matthew R McMahon
(74) *Attorney, Agent, or Firm* — Troutman Sanders LLP; Ryan A. Schneider; Christopher C. Close, Jr.

(57) ABSTRACT

A control wire clamp for securing a control member, such as a control wire, in place is disclosed. The default state of the control wire clamp may be a clamped state. The control wire clamp may be placed in an unclamped state by applying force to a clamp handle.

17 Claims, 5 Drawing Sheets

(51) Int. Cl.
*F16B 2/18* (2006.01)
*A47G 33/10* (2006.01)

(56) References Cited

U.S. PATENT DOCUMENTS

| | | | | |
|---|---|---|---|---|
| 1,243,106 A | * | 10/1917 | Richardson | E06B 9/324 24/134 KB |
| 1,597,181 A | * | 8/1926 | Dennis | B65D 77/185 24/134 R |
| 1,601,046 A | * | 9/1926 | Shannon | E05B 73/00 70/65 |
| 3,593,386 A | | 7/1971 | Hug | |
| 4,300,269 A | * | 11/1981 | Boden | F16G 11/101 24/134 R |
| 4,387,489 A | * | 6/1983 | Dudek | A44B 11/06 24/133 |
| 4,639,978 A | * | 2/1987 | Boden | F16G 11/101 24/132 R |
| 5,279,020 A | * | 1/1994 | Coe | F16G 11/101 24/132 WL |
| 5,548,873 A | * | 8/1996 | Macias | F16G 11/106 24/115 G |
| 6,212,919 B1 | * | 4/2001 | Gerow | E05B 67/003 24/132 R |
| 6,339,867 B1 | * | 1/2002 | Azam | A43C 7/08 24/115 G |
| 6,672,664 B2 | * | 1/2004 | Yanaka | B60N 2/2806 24/134 KB |
| 6,868,585 B2 | * | 3/2005 | Anthony | A44B 11/14 24/134 R |
| 7,549,569 B2 | * | 6/2009 | Kwan | B23K 20/004 228/110.1 |
| 7,770,268 B2 | * | 8/2010 | Breuer | A43C 7/08 24/136 R |
| 8,088,053 B2 | * | 1/2012 | Whyatt | A63B 21/018 482/143 |
| 9,038,247 B2 | * | 5/2015 | Dodge | F16G 11/101 24/132 WL |
| 9,101,173 B1 | | 8/2015 | Loomis et al. | |
| 9,226,531 B2 | * | 1/2016 | Keathley | A41D 3/00 |
| 2013/0160256 A1 | | 6/2013 | Waldman et al. | |
| 2014/0208551 A1 | | 7/2014 | Ben-Arie | |
| 2015/0040360 A1 | | 2/2015 | Manganaro et al. | |
| 2017/0356713 A1 | * | 12/2017 | Williams | F41A 23/02 |

FOREIGN PATENT DOCUMENTS

| | | |
|---|---|---|
| GB | 2522537 A | 7/2015 |
| NL | 7700782 A | 7/1978 |

\* cited by examiner

CONTROL WIRE CLAMP AND LOOP SYSTEMS AND METHODS

CROSS-REFERENCE TO PRIORITY CLAIM

This application claims the benefit, under 35 U.S.C. § 119(e), of U.S. Provisional Patent Application No. 62/349,853, filed 14 Jun. 2016, entitled "Control Wire Clamp Systems and Methods," the entire contents and substance of which are incorporated herein by reference in their entireties as if fully set forth below.

TECHNICAL FIELD

Aspects of the present disclosure relate to a clamp apparatus for securing control wires, and, more particularly, for securing control wires used to place hinged branches of an artificial Christmas tree in a stowed position.

BACKGROUND

Clamps are well-known fastening devices that may be used to hold or secure objects tightly in place by applying inward pressure between two clamping surfaces. But existing clamp designs may not be suitable to adjustably secure a control member (e.g., a loop of wire, string, rope, twine, cord, or the like) used in an artificial tree apparatus to position and secure branches into a stowed position. It may be desirable to connect such a control member to a plurality of branches such that the control member forms a loop that surrounds the trunk of the artificial tree apparatus. It also may be desirable to use a clamping device to transition, and maintain, the plurality of branches in a stowed position (e.g., the branches are substantially parallel to the trunk of the artificial tree) or a deployed position (e.g., the branches are substantially perpendicular to the trunk of the artificial tree). In some embodiments, the control member may form a closed loop and the clamping device may contact the control member in two or more locations along the control member such that a larger loop is formed about the artificial tree apparatus and a smaller loop is formed on the side of the clamping mechanism opposite the artificial tree apparatus. To transition the branches to a stowed position, the smaller loop can be pulled or otherwise adjusted, which may decrease the diameter of the larger loop, forcing the tree branches from a deployed position to a stowed position. This may effect a reduction in the volume of the tree and may provide for easier storage.

In some embodiments, the control member may not be a closed loop (i.e., the control member has two unconnected ends), but the control member may be connected to the plurality of branches such that it may substantially encompass the trunk of artificial tree apparatus, which may form a looped portion of the control member. The size of the looped portion may be adjusted to a stowed position by pulling or otherwise adjusting one or both ends of the control member away from the artificial tree apparatus and cinching the control member with a clamping device to maintain the current, decreased diameter of the loop. The loop may be adjusted to a deployed position by pulling a portion of the loop away from the clamping device and cinching the control member with the clamping device to maintain the increased diameter of the loop.

Current clamp designs may fail to adequate secure a control member to maintain a stowed or deployed position of the control member, and/or current clamp designs may be cumbersome or difficult to use while creating tension or slack in a loop of the control member that may be connected to the plurality of branches. Specifically, it may be difficult to release the clamping pressure or otherwise un-cinch the control member, and it may also be difficult to apply clamping pressure or other cinch the control member. Additionally, it may be difficult to cinch or un-cinch a control member with existing clamping devices while using only a single hand, as it may be necessary to use a second hand to move the control member relative the clamping device. Therefore, there is a need for a system that can adjustably secure a control member that may be used to adjust the size of a control loop. There is also a need for a system that can be easily adjusted between a clamped position and an unclamped position. There is additional need for a system that be easily adjusted between a clamped position and an unclamped position with the use of a single hand.

BRIEF DESCRIPTION OF THE FIGURES

Reference will now be made to the accompanying figures, which are not necessarily drawn to scale, and wherein.

DETAILED DESCRIPTION

Figure 1:
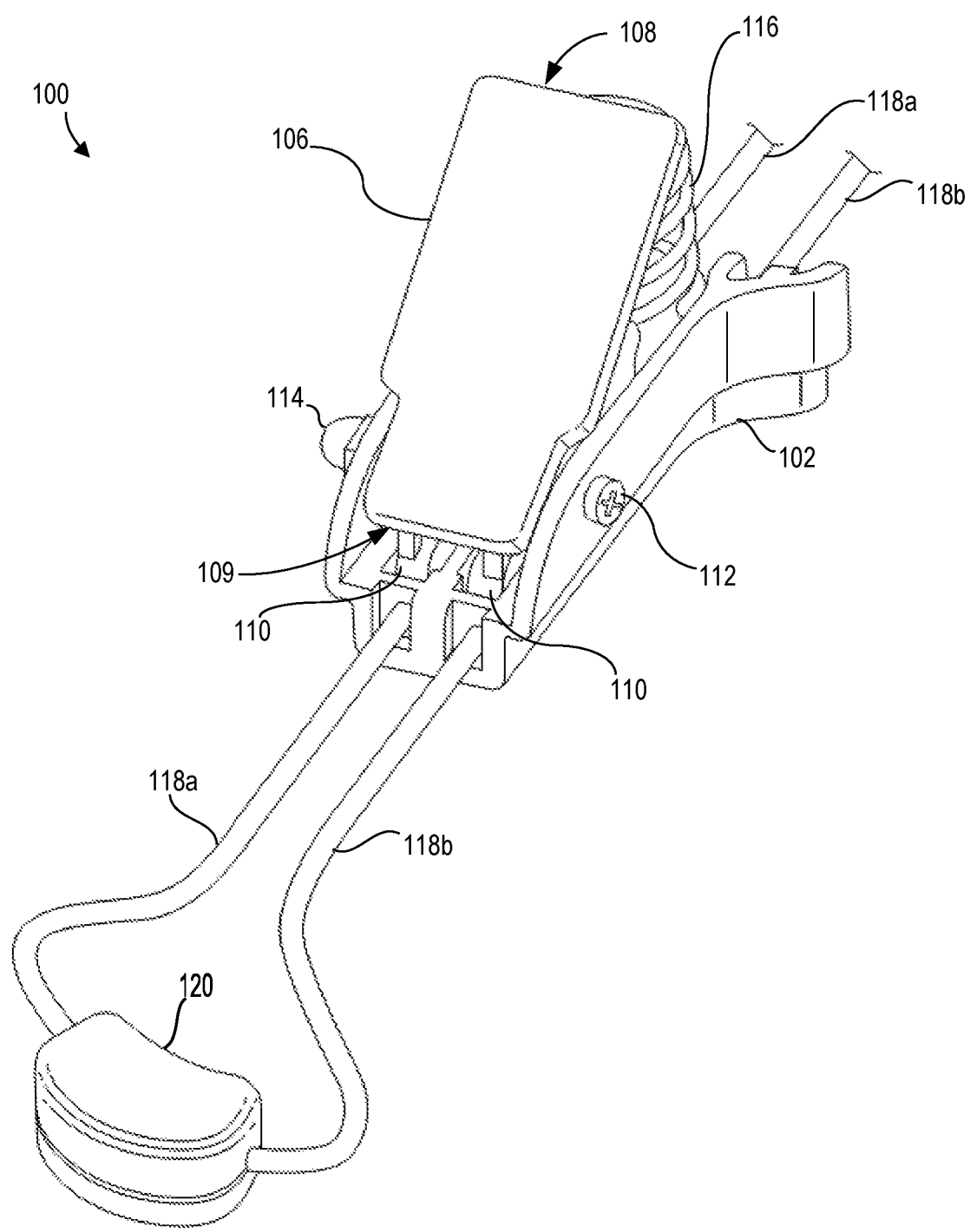
FIG. 1 is a perspective view of a control wire clamp, in accordance with an example embodiment of the presently disclosed subject matter.

The present disclosure can be understood more readily by reference to the following detailed description of exemplary embodiments and the examples included herein. Before the exemplary embodiments of the devices and methods according to the present disclosure are disclosed and described, it is to be understood that embodiments are not limited to those described within this disclosure. Numerous modifications and variations therein will be apparent to those skilled in the art and remain within the scope of the disclosure. It is also to be understood that the terminology used herein is for the purpose of describing specific embodiments only and is not intended to be limiting. Some embodiments of the disclosed technology will be described more fully hereinafter with reference to the accompanying drawings. This disclosed technology may, however, be embodied in many different forms and should not be construed as limited to the embodiments set forth therein.

In the following description, numerous specific details are set forth. However, it is to be understood that embodiments of the disclosed technology may be practiced without these specific details. In other instances, well-known methods, structures, and techniques have not been shown in detail in order not to obscure an understanding of this description. References to "one embodiment," "an embodiment," "example embodiment," "some embodiments," "certain embodiments," "various embodiments," etc., indicate that the embodiment(s) of the disclosed technology so described may include a particular feature, structure, or characteristic, but not every embodiment necessarily includes the particular feature, structure, or characteristic. Further, repeated use of the phrase "in one embodiment" does not necessarily refer to the same embodiment, although it may.

Unless otherwise noted, the terms used herein are to be understood according to conventional usage by those of ordinary skill in the relevant art. In addition to any definitions of terms provided below, it is to be understood that as used in the specification and in the claims, "a" or "an" can mean one or more, depending upon the context in which it is used. Throughout the specification and the claims, the following terms take at least the meanings explicitly associated herein, unless the context clearly dictates otherwise. The term "or" is intended to mean an inclusive "or." Further, the terms "a," "an," and "the" are intended to mean one or more unless specified otherwise or clear from the context to be directed to a singular form.

Unless otherwise specified, the use of the ordinal adjectives "first," "second," "third," etc., to describe a common object, merely indicate that different instances of like objects are being referred to, and are not intended to imply that the objects so described must be in a given sequence, either temporally, spatially, in ranking, or in any other manner.

Also, in describing the exemplary embodiments, terminology will be resorted to for the sake of clarity. It is intended that each term contemplates its broadest meaning as understood by those skilled in the art and includes all technical equivalents that operate in a similar manner to accomplish a similar purpose.

To facilitate an understanding of the principles and features of the embodiments of the present disclosure, example embodiments are explained hereinafter with reference to their implementation in an illustrative embodiment. Such illustrative embodiments are not, however, intended to be limiting.

The materials described hereinafter as making up the various elements of the embodiments of the present disclosure are intended to be illustrative and not restrictive. Many suitable materials that would perform the same or a similar function as the materials described herein are intended to be embraced within the scope of the example embodiments. Such other materials not described herein can include, but are not limited to, materials that are developed after the time of the development of the disclosed technology, for example.

Embodiments of the disclosed technology include a control wire clamp for securing a control member in place. In various embodiments, a control wire clamp may be used to adjustably secure a control member configured to be tightened around an artificial Christmas tree to drive the tree's branches upwards into a stowed position to facilitate ease of storage. Such trees and control members are shown in U.S. Pat. No. 9,101,173, the contents of which are hereby incorporated by reference. In some embodiments, the control wire clamp may have two states—a clamped state and an unclamped state. In the clamped state, a spring may provide a force against the control wire clamp, which in turn exerts a clamping force on the control member, securing it in place. In the unclamped state, a user may apply force to a clamp handle to compress the spring, which in turn may release the clamping force on the control member, thereby allowing the control member to be pulled through the channels of the body of the control wire clamp in either a forward or reverse direction. According to some embodiments, the control wire clamp may rest in the clamped state by default.

As will be understood, a control member may comprise a first portion (i.e., a loop) that encompasses the tree and then feeds through the control wire clamp to provide a second portion for user engagement. This second portion may be a second, smaller loop, or first and second wire ends, which are unconnected. When the control wire clamp is in the unclamped state, a user can pull the second portion through the control wire clamp and away from the tree such that, which can cause the first portion (i.e., the control loop) to tighten around the Christmas tree. As explained, in some embodiments, the first portion of the control member may form a control loop around a plurality of tree branches, making contact with the underside of each branch. Tightening the control member (i.e., pulling the second portion through the control wire clamp and away from the tree) may cause the branches, which may initially be in a generally horizontal position, to rotate into a generally vertical position. The branches may be hingedly attached to the trunk of the artificial Christmas trees, thus allowing the branches to rotate from deployed to stowed positions upon tightening of the control member. When the tree branches are in the desired position for storage, a user may release force on the clamp handle (i.e., return the control wire clamp to the clamped state) thus clamping or securing the control member so that the branches of the artificial tree may remain in a generally vertical position for storage.

Throughout this disclosure, certain embodiments are described in exemplary fashion in relation to securing a tightened control member of an artificial Christmas tree. But embodiments of the disclosed technology are not so limited. In some embodiments, the disclosed technique may be effective in securing control members comprising, for example, one or two wires or wire segments, that may be used to control and/or secure other objects.

Figure 2:
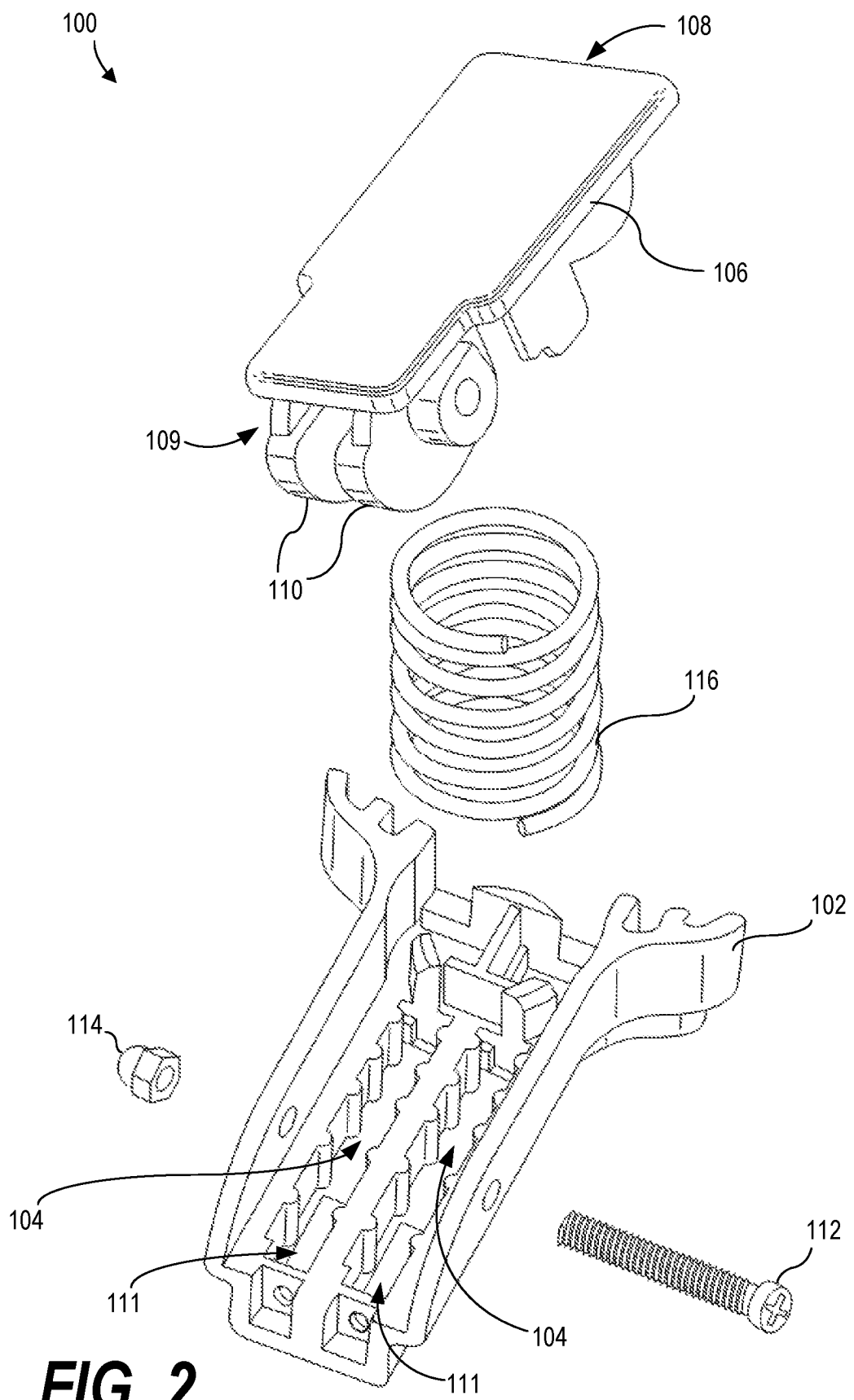
FIG. 2 is an exploded view of a control wire clamp, in accordance with an example embodiment of the presently disclosed subject matter.

Referring now to the drawings, FIGS. 1 and 2 are an example embodiment of a control wire clamp 100. As described above, a control wire clamp 100 may be used to secure a control member 118 in place when the control wire clamp 100 is in a clamped state. A control member 118 may generally have a first portion that is positioned on a first side of the control wire clamp 100 (e.g., the portion of the control member 118 that loops around a Christmas tree's branches) and a second portion that is positioned on a second side of the control wire clamp 100 (e.g., the portion of the control member 118 with which the user engages to tighten or loosen the first portion of the control member 118). The amount of the portion of the control member 118 that is positioned on the first or second sides of the control wire clamp 100 may be adjusted by pulling the control member 118 in either a forward or rear direction. As such, the control wire clamp 100 may allow the control member 118 to be drawn through the body of the control wire clamp 100 in a forward or reverse direction when in an unclamped state. Accordingly, the control member 118 may be adjusted to the desired length, position, or tension when the control wire clamp 100 is in the unclamped state, and then may be tightly secured in the desired position by returning the control wire clamp 100 to the clamped position. According to some embodiments, a control member 118 may be a flexible rod, a wire, a string, a rubber band, a piece of elastic material, or any other material that may capable of forming a loop of adjustable diameter. In some embodiments, the control member 118 may have a control member tab 120 at one end that provides a surface that a user may order to more easily pull the control member 118 away from the control wire clamp 100 (e.g., to tighten the loop on the opposing side of the control wire clamp 100).

Although this disclosure is directed towards a control member 118 wherein the first portion forms a loop such that the control member 118 passes through the clamp base 102 in two places (i.e., two segments 118a and 118b of the control member 118 pass through the control wire clamp 100, as shown in FIGS. 1 and 2), it should be understood that in some embodiments, the portion of the control member 118 that is on the second side of the control wire clamp 100 may not form a loop. Thus, in some embodiments the control wire clamp 100 may receive a single control member 118 segment (e.g., a single wire segment instead of the two wire segments (e.g., 118a and 118b) discussed above).

In some embodiments, a control wire clamp 100 may comprise a clamp base 102, a clamp handle 106, and a spring 116. The clamp handle 106 may have a rear end 108. According to some embodiments, a user may press down on the rear end 108 of the clamp handle 106 to place the control wire clamp 100 into the unclamped state. When the clamp handle 106 is released, the control wire clamp 100 may automatically revert to the clamped state.

In some embodiments, the transition from the unclamped state to a clamped state may result from the spring force provided by the spring 116. In some embodiments, the clamp base 102 may include a spring securing element that may act to secure the bottom of the spring 116 to the clamp base 102. In some embodiments, the spring securing element may be a rounded protrusion that extends out from a surface of the clamp base 102 such that a bottom portion of the spring may fit snuggly around the rounded protrusion. In other embodiments, the spring securing element may be, for example, one or more staples, adhesives, pins, or any other suitable apparatus that may be effective in securing the a bottom portion of the spring 116 to the clamp base 102. In some embodiments, a top portion of the spring 116 may be in contact with the underside of the clamp handle 106. Accordingly, in some embodiments, the spring 116 may be securely housed between the underside of the handle 106 and a surface of the clamp base 102. Thus, in some embodiments, when a downward force is applied to the rear end 108 of the clamp handle 106 (by, for example, a user pressing down on the rear end 108 of the clamp handle 106), that force may drive the clamp handle 106 downward into the spring 116, causing the spring 116 to compress. When the force on the rear end 108 of the clamp handle 106 is released (e.g., by a user releasing the clamp handle 106), the spring force of the spring 116 may act to drive the rear end 108 of the clamp handle 106 upward and away from the clamp base 102.

According to some embodiments, a front end 109 of the clamp handle 106 may be rotatably coupled to the clamp base 102. In some embodiments, one or two sides of the clamp handle 106 at or near the front end 109 and a corresponding one or two sides of clamp base 102 may include apertures that align with one another such that a bolt 112 may extend through the apertures of the clamp handle 106 and clamp base 102 to rotatably couple the clamp handle 106 to the clamp base 102. Accordingly, in some embodiments the clamp handle 106 may be enabled to rotate about the bolt 112. The bolt 112 may be secured by, for example, a nut 114. Some embodiments may be otherwise configured to rotate at or near the front end 109. For example, some embodiments may include rounded protrusions on the clamp handle 106 that are configured to mate with concave depressions in the clamp base 102 (or vice versa). One of skill in the art will realize that other configurations enabling the clamp handle 106 to be rotatably coupled to the clamp base 102 are herein contemplated.

As shown in FIG. 2, in some embodiments, the clamp base 102 may include two base channels 104 that may accommodate a portion of the control member 118. The base channels 104 may serve to laterally secure the control member 118 within the clamp base 102. In some embodiments, the base channels 104 may be positioned underneath the front end 109 of the clamp handle 106. The base channels 104 may traverse the length of the clamp base 102 and be configured to receive a control member 118 at a first end, allow the control member 118 to extend through the length of the base channel 104 and exit the opposite end. In some embodiments, a base channel 104 may comprise a recess 111 in the body of the clamp base 102. As shown in FIG. 1, in some embodiments, base channels 104 may each comprise a curved or jagged recess 111. The curved or jagged edges of each recess 111 may serve to provide surfaces that provide friction, which may act upon the control member 118 if the control member 118 is pulled away from the clamp base 102 in either a forward or reverse direction.

Figure 3A:
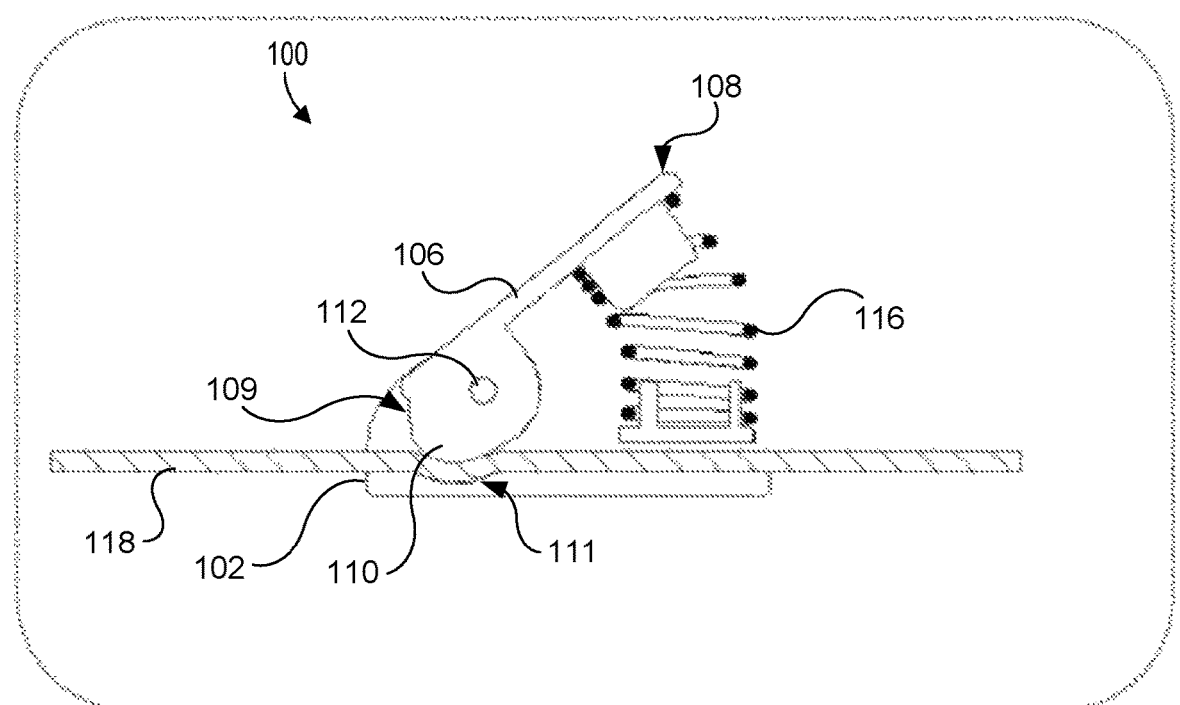
FIG. 3A is a cross-sectional side view of a control wire clamp and control member in a clamped state, in accordance with an example embodiment of the presently disclosed subject matter.
Figure 3B:
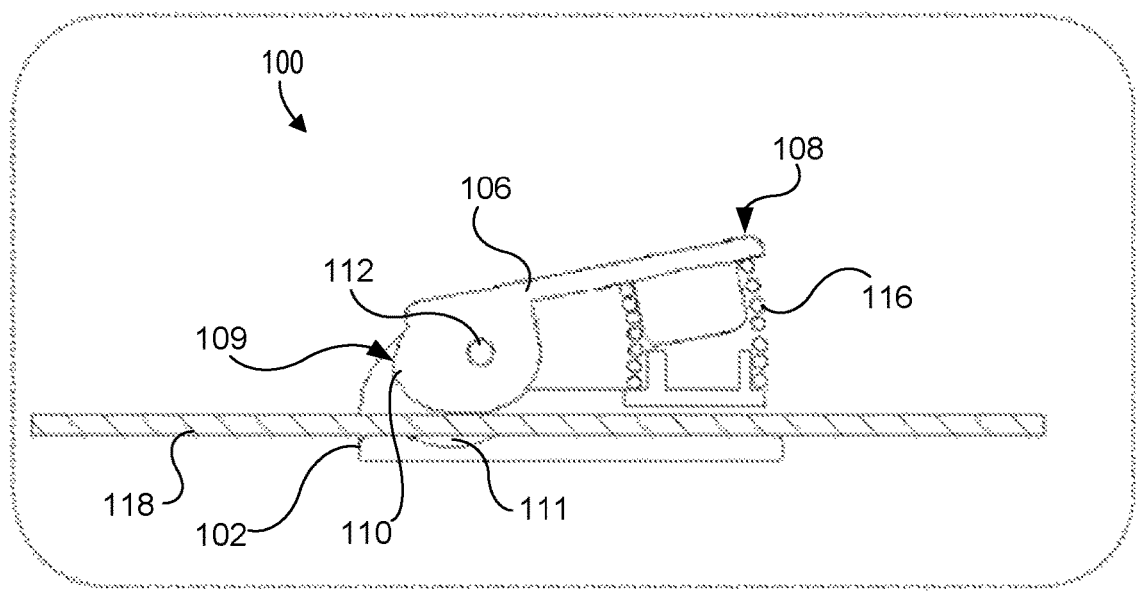
FIG. 3B is a cross-sectional side view of a control wire clamp and control member in an unclamped state, in accordance with an example embodiment of the presently disclosed subject matter.

FIG. 3A shows the control wire clamp 100 in the clamped state, and FIG. 3B shows the control wire clamp in the unclamped state. As described above, the clamp handle 106 may be rotatably attached to the clamp base 102. In some embodiments, the front end 109 of the clamp handle 106 may include one or more protruding edges 110. The front end may have a generally circular cross-section from which the protruding edges 110 may jut out. In some embodiments, the protruding edges 110 may be configured to come into close proximity (i.e., closer than the remainder of the front end 109) of the recesses 111 of the clamp base 102, which may serve to secure the control member 118 when the control wire clamp 100 is in the clamped state. In some embodiments, the protruding edges 110 may extend away from the main body of the clamp handle 106 in such a manner that when the control wire clamp 100 is in a clamped state, the protruding edges 110 of the front end 109 of the clamp handle 106 can extend down into the base channels 104 and make contact with the control member 118, as shown in FIG. 3A. As can be seen in FIG. 3A, the protruding edges 110 can exert a downward force onto the control member 118, thereby securing (or pinning) the control member 118 to the clamp base 102 and acting to prevent the control member 118 from being pulled in either a forward or reverse direction. As described above, the spring force of the spring 116 can apply an upward force to the rear end 108 of the clamp handle 106, which is translated to a rotational force about a pivot point of the control wire clamp 100 (e.g., about the bolt 112) that serves to push the protruding edges 110 into the base channels 104. As shown in FIG. 3B, when a downward force is applied to the rear end 108 of the clamp handle 106, the front end 109 of the clamp handle 106 is caused to rotate such that the protruding edges 110 exit the recesses 111 of the base channels 104, thereby releasing the pinching pressure that secured the control member 118 between the protruding edges 110 of the front end 109 of the clamp handle 106 and the recess 111 in the channels 104 of the clamp base 102. Thus, once released, the unpinned control member 118 may be free to be pulled though the base channels 104 in either direction.

Figure 4A:
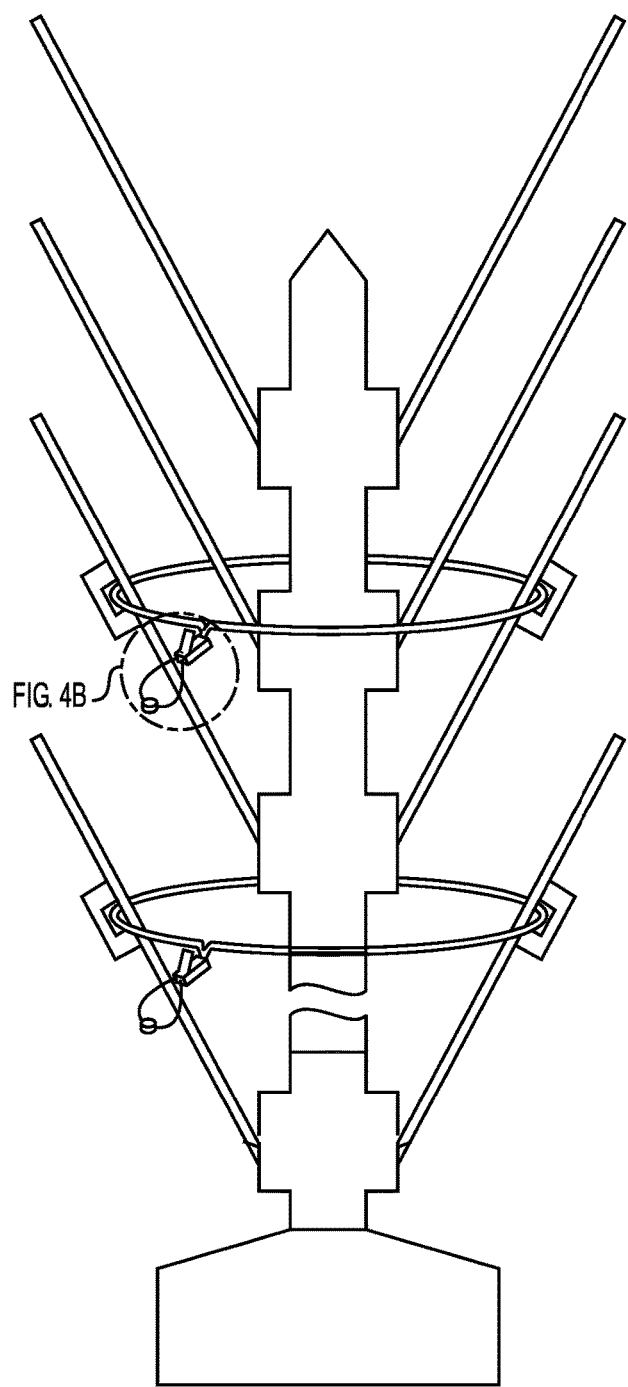
FIG. 4A is a perspective view a control wire clamp and control member in use with an artificial tree in a stowed position, in accordance with an example embodiment of the presently disclosed subject matter.
Figure 4B:
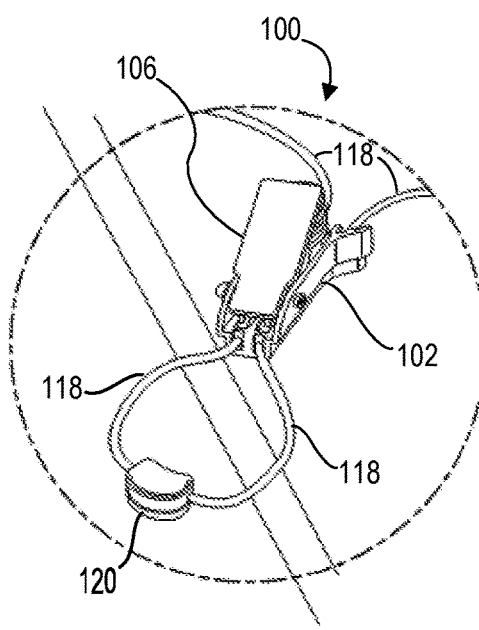
FIG. 4B is an up-close view of a control wire clamp when in use with an artificial tree in a stowed position, in accordance with an example embodiment of the presently disclosed subject matter.
Figure 5A:
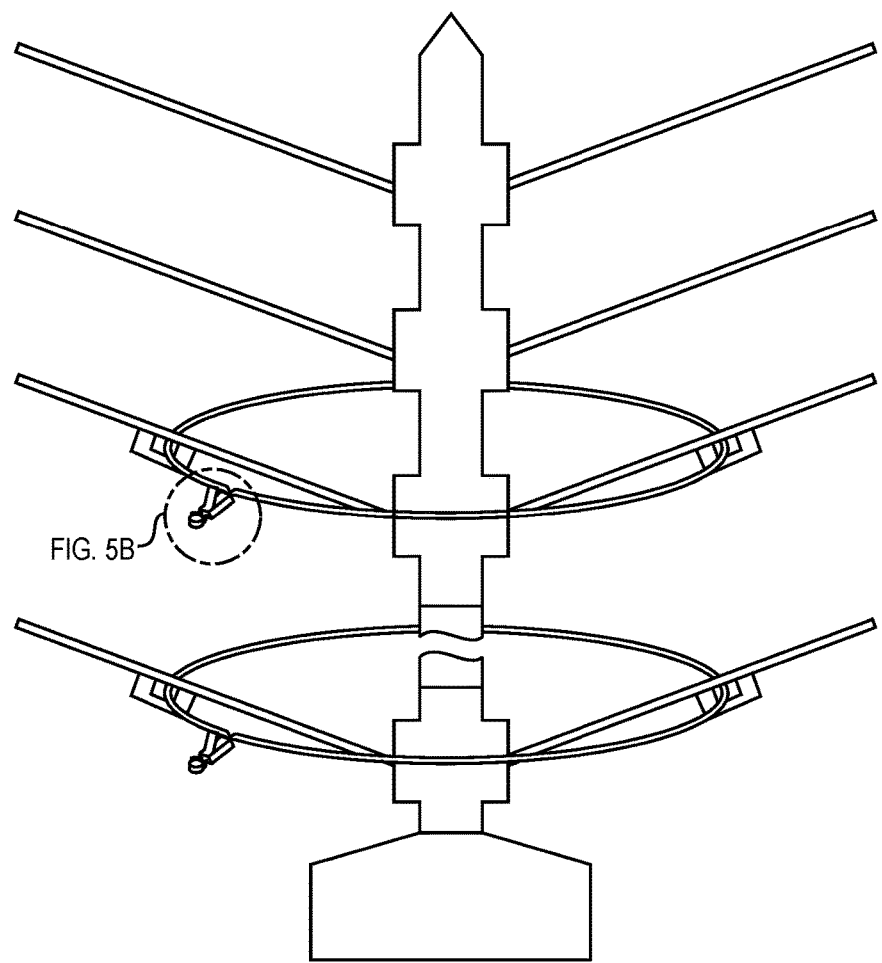
FIG. 5A is a perspective view of a control wire clamp and control member in use with an artificial tree in a deployed position, in accordance with an example embodiment of the presently disclosed subject matter.
Figure 5B:
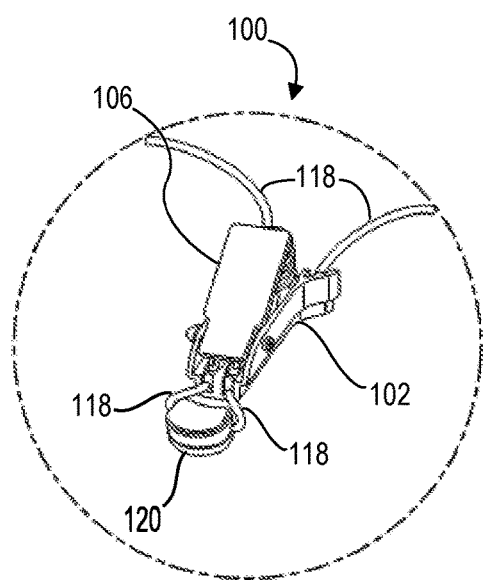
FIG. 5B is an up-close view of a control wire clamp when in use with an artificial tree in a deployed position, in accordance with an example embodiment of the presently disclosed subject matter.

FIGS. 4A, 4B, 5A, and 5B depict a control wire clamp 100 in use with an artificial tree. FIGS. 5A and 5B show the control wire clamp 100 in a clamped state, while the branches of the artificial tree are in the deployed position. As shown in FIG. 5B, only a small portion of the control member 118 is positioned in front of the control wire clamp 100 (i.e., in the second position). FIGS. 4A and 4B show the control wire clamp 100 in the clamped state and the artificial tree in the stowed position. To transition from the position depicted in FIG. 4 to the position depicted in FIG. 5 (or vice versa), the control wire clamp 100 can be placed in the unclamped state; the control member 118 can be pulled in a forward or reverse direction, tightening or loosening the loop around the branches; and the control wire clamp 100 can be returned to the clamped position, securing the branches along the trunk of the artificial tree. As can be seen from FIGS. 4B and 5B, a substantially greater portion of the control member 118 can be positioned in front of the control wire clamp 100 in FIG. 4B (i.e., when the tree is in the stowed position) than in FIG. 5B (i.e., when the tree is in the deployed position). Furthermore, it can be seen in FIG. 4A that the tree branches can be forced into a generally vertical position (i.e., generally parallel to the trunk of the artificial tree) by the control member 118 such that the artificial tree may be more easily stored, as compared to the position depicted in FIG. 5A.

While certain embodiments of the disclosed technology have been described in connection with what is presently considered to be the most practical embodiments, it is to be understood that the disclosed technology is not to be limited to the disclosed embodiments, but on the contrary, is intended to cover various modifications and equivalent arrangements included within the scope of the appended claims. Although specific terms are employed herein, they are used in a generic and descriptive sense only and not for purposes of limitation.

This written description uses examples to disclose certain embodiments of the disclosed technology, including the best mode, and also to enable any person skilled in the art to practice certain embodiments of the disclosed technology, including making and using any devices or systems and performing any incorporated methods. The patentable scope of certain embodiments of the disclosed technology is defined in the claims, and may include other examples that occur to those skilled in the art. Such other examples are intended to be within the scope of the claims if they have structural elements that do not differ from the literal language of the claims, or if they include equivalent structural elements with insubstantial differences from the literal language of the claims.

What is claimed is:

1. A clamping device comprising:
 a handle having a first end and a second end, the handle including a first protrusion and a second protrusion, each of the first and second protrusions having a smooth outer surface;
 a base having a first end and a second end, the base including:
  a first channel traversing a length of the base and configured to receive both a first segment of a control wire and at least a portion of the first protrusion of the handle, the first channel including a first pair of opposing sidewalls extending from the first end of the base to the second end of the base;
  a first recess disposed within the first channel and between the first pair of opposing walls, the first recess configured to align with at least a portion of the first protrusions;
  a second channel traversing the length of the base and configured to receive both a second segment of the control wire and at least a portion of the second protrusion of the handle, the second channel including a second pair of opposing sidewalls extending from the first end of the base to the second end of the base; and
  a second recess disposed within the second channel and between the second pair of opposing sidewalls, the second recess configured to align with at least a portion of the second protrusion; and
 a spring having a bottom portion attached to the base and a top portion attached to the handle, the spring configured to exert a force on the second end of the handle causing the second end of the handle to transition away from the second end of the base such that the first end of the handle is caused to direct force toward the first end of the base,
 wherein the first and second protrusions are configured to press the first and second segments of the control wire into the first and second recesses, respectively, as the spring transitions from a compressed position to an extended position, and
 wherein the spring is configured to transition from the extended position to the compressed position as the second end of the handle is moved toward the second end of the base, the transition causing the first and second protrusions to move away from the first and second recesses such that the first and second segments of the control wire are released from the first and second recesses, respectively.

2. The clamping device of claim 1 further comprising a control wire having a first segment and a second segment, wherein when the first segment of the control wire is in the first channel and the second segment of the control wire is in the second channel, a forward loop extends from the first end of the base and a rear loop extends from the second end of the base.

3. The clamping device of claim 1, wherein the bottom portion of the spring is attached proximate the second end of the base and the top portion of the spring is attached near the second end of the handle.

4. The clamping device of claim 1 further comprising a bolt and a nut, wherein the handle is rotatably connected to the base by the bolt and the nut.

5. The clamping device of claim 1, wherein the first protrusion is a first rounded protrusion, the second protrusion is a second rounded protrusion, the first recess of the base comprises a first concave depression configured to receive the first rounded protrusion, and the second recess of the base comprises a second concave depression configured to receive the second rounded protrusion.

6. The clamping device of claim 1, wherein the second channel is separate and distinct from the first channel.

7. A clamping system comprising:
 a base having a first end and a second end, the base including first and second channels each extending from the first end of the base to the second end of the base, each channel including a pair of opposing sidewalls, at least a portion of each of the sidewalls having an undulating profile, the first channel comprising a first recess and the second channel comprising a second recess;

a handle rotatably coupled to the base, the handle having a first end that includes a protruding edge, the protruding edge comprising a first protrusion configured to extend into the first channel and a second protrusion configured to extend into the second channel;

a control wire loop, the control wire loop having a first segment extending through the first channel and a second segment extending through the second channel; and a spring configured to exert a force onto the second end of the base and a second end of the handle such that the first end of the base is forced toward the first end of the handle, causing at least a portion of the control wire loop to be pinched between the first end of the base and the first end of the handle;

wherein when the spring is in an extended position, the first and second protrusions press the first and second segments of the control wire into the first and second recesses, respectively; and wherein the spring is configured to transition from the extended position to a compressed position as the second end of the handle is moved toward the second end of the base, the transition causing the first and second protrusions to move away from the first and second recesses such that the first and second segments of the control wire are released from the first and second recesses, respectively.

8. The clamping system of claim 7, wherein a forward loop extends from the first and second channels at the first end of the base and a rear loop extends from the first and second channels at the second end of the base.

9. The clamping system of claim 8 further comprising a tab attached to the forward loop.

10. The clamping system of claim 9, wherein the rear loop passes through a plurality of hoops, each hoop connected to a branch of an artificial tree.

11. The clamping system of claim 7, wherein the first protrusion is disposed on a first side of the first end and the second protrusion is disposed on a second side of the first end, the second side being opposite the first side and the second protrusion being separate and distinct from the first protrusion, each of the first and second protrusions having a smooth outer surface.

12. An artificial tree binding system comprising:

an artificial tree trunk segment including a plurality of branches hingedly connected to the trunk segment, wherein at least one of the plurality of branches includes an aperture;

a control wire passing through the at least one aperture to create a tree loop; and a clamping mechanism including:

a base having a first channel and a second channel, the first and second channels extending from a first end of the base to a second end of the base, wherein each channel includes a smooth bottom surface and a pair of opposing sidewalls extending from the first end of the base to the second end of the base, at least a portion of each of the sidewalls having a jagged profile, the first channel comprising a first recess, and the second channel comprising a second recess;

a handle rotatably coupled to the base, the handle having a first end and a second end, the first end including a first protrusion configured to extend into the first channel and a second protrusion configured to extend into the second channel;

a compression spring configured to exert a force on the second end of the handle and the second end of the base such that the first end of the handle is biased toward the first end of the base, wherein a first segment of the control wire passes through the first channel and a second segment of the control wire passes through the second channel;

wherein when the spring is in an extended position, the first and second protrusions press the first and second segments of the control wire into the first and second recesses, respectively; and wherein the spring is configured to transition from the extended position to a compressed position as the second end of the handle is moved toward the second end of the base, the transition causing the first and second protrusions to move away from the first and second recesses such that the first and second segments of the control wire can be released from the first and second recesses, respectively.

13. The artificial tree binding system of claim 12, wherein the tree loop has a first diameter when the tree loop is taut and the tree loop has a second diameter when the tree loop is slack.

14. The artificial tree binding system of claim 13, wherein the plurality of branches are substantially parallel to the trunk segment when the tree loop has the first diameter.

15. The artificial tree binding system of claim 12, wherein the control wire is a loop of control wire such that a pull loop extends from the first and second channels at the first end of the base.

16. The artificial tree binding system of claim 15 further comprising a tab attached to the pull loop.

17. The artificial tree binding system of claim 12, wherein the first protrusion is disposed on a first side of the first end and the second protrusion is disposed on a second side of the first end, the second side being opposite the first side and the second protrusion being separate and distinct from the first protrusion, each of the first and second protrusions having a smooth outer surface.

* * * * *